United States Patent
Schaeffer et al.

(10) Patent No.: US 7,445,976 B2
(45) Date of Patent: Nov. 4, 2008

(54) METHOD OF FORMING A SEMICONDUCTOR DEVICE HAVING AN INTERLAYER AND STRUCTURE THEREFOR

(75) Inventors: James K. Schaeffer, Austin, TX (US); Rama I. Hegde, Austin, TX (US); Srikanth B. Samavedam, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 124 days.

(21) Appl. No.: 11/420,525

(22) Filed: May 26, 2006

(65) Prior Publication Data
US 2007/0272975 A1 Nov. 29, 2007

(51) Int. Cl.
*H01L 21/00* (2006.01)

(52) U.S. Cl. .................... 438/197; 438/199; 438/151

(58) Field of Classification Search ............... 438/199, 438/197, 151
See application file for complete search history.

(56) References Cited

U.S. PATENT DOCUMENTS

| | | | |
|---|---|---|---|
| 5,093,174 A | | 3/1992 | Suzuki et al. |
| 5,352,917 A | * | 10/1994 | Ohmi ...................... 257/410 |
| 5,854,097 A | | 12/1998 | Ohmi et al. |
| 6,383,346 B2 | | 5/2002 | Ando et al. |
| 6,451,184 B1 | | 9/2002 | Sone |
| 6,458,253 B2 | | 10/2002 | Ando et al. |
| 6,759,097 B2 | | 7/2004 | Phillips et al. |
| 6,838,357 B2 | | 1/2005 | Chen et al. |
| 7,087,480 B1 | * | 8/2006 | Yao et al. ................... 438/240 |
| 7,332,433 B2 | * | 2/2008 | Choi et al. ................. 438/685 |
| 2004/0222474 A1 | * | 11/2004 | Chau et al. ................ 257/369 |
| 2006/0115940 A1 | * | 6/2006 | Kim et al. .................. 438/197 |
| 2007/0272975 A1 | * | 11/2007 | Schaeffer et al. ........... 257/327 |
| 2008/0017930 A1 | * | 1/2008 | Kim et al. .................. 257/369 |

OTHER PUBLICATIONS

G. S. Chen, Investigation of electron-beam-induced phase transitions in amorphous aluminum trifluoride thin films using transmission electron microscopy, J. Vac. Sci. Technol. A vol. 17, No. 2, pp. 403-410, Mar./Apr. 1999.

Shunsuke Niisaka, Tadahiko Saito, Jun Saito, Akira Tanaka, Akira Matsumoto, Minoru Otani, Tyuji Biro, Chidane Ouchi, Masanobu Hasegawa, Yasuyuki Suzuki, and Kasuho Sone, Development of optical coatings for 157-nm lithography, Applied Optics, vol. 41, No. 16, pp. 3242-3247, Jun. 1, 2002.

James D. Targove, Densification of aluminum fluoride thin films by ion-assisted deposition, The Solid Films, vol. 159, pp. 57-59, 1988 The Netherlands.

(Continued)

*Primary Examiner*—Laura M Menz
(74) *Attorney, Agent, or Firm*—Kim-Marie Vo; David G. Dolezal

(57) ABSTRACT

A stack located over a substrate. The stack includes a layer between a dielectric layer and a metal layer. The layer includes a halogen and a metal. In one embodiment, the halogen is fluorine. In one embodiment, the stack is a control electrode stack for a transistor. In one example the control electrode stack is a gate stack for a MOSFET. In one example, the layer includes aluminum fluoride.

22 Claims, 3 Drawing Sheets

OTHER PUBLICATIONS

G. S. Chen, Electron-beam induced crystallization transition in self-developing amorphous AlF3 resists, Appl. Phys. Lett. vol. 62, No. 2, pp. 170-172, Jul. 8, 1996.

G. S. Chen, Crystallization tranformations in vacuum-deposited amorphous aluminum fluoride self-developing thin-film resists induced by electron-beam irradiation, J. Vac. Sci. Technol. A vol. 20, No. 3, pp. 986-990, May/Jun. 2002.

A. Le Bail, C. Jacoboni, M. Leblanc, R. De Pape, H. Duroy, and J. L. Fourquet, Crystal Structure of the Metastable Form of Aluminum Trifluoride B-AlF3 and the Gallium and Indium Homologs, Journal of Solid Stae Chemistry, vol. 77, pp. 96-101, 1988.

A. N. Utkin, G. V. Girichev, N. I. Giricheva, S.V. Khaustov, Structure and vibrational frequencies of aluminum trifluoride and gallium, vol. 27, No. 2, pp. 43-46, 1986 USSR.

A. M. Phahle, A. E. Hill and J. H. Calderwood, Dielectric Properties of Thin Aluminum Fluoride Films, Thin Solid Films, vol. 22, pp. 67-74, 1974, Switzerland.

L. I. Vergara, R. Vidal, J. Ferron, Electron induced reduction on AlF3 thin films, Applied Surface Science vol. 229, pp. 301-310, 2004.

Elmar Ritter and Rolf Hoffmann, Influence of Substrate Temperature on the Condensation of Vacuum Evaporated Films of MgF2 and ZnS, J. Vac. Sci. Technol. USA, vol. 6, No. 4, pp. 733-736, 1969.

Mikhail F. Butman, Junji Nakamura, and Hiroyuki Kawano, Thermal ion emission from potassium fluoride deposited on a substrate-metal surface, Applied Surface Science, vol. 78, No. 4, pp. 421-435, 1994, Netherlands.

J. T. Cox, G. Hass, and J. E. Waylonis, Further Studies on LiF-Overcoated Aluminum Mirrors with Highest Reflectance in the Vaccum Ultraviolet, Applied Optics, vol. 7, No. 8, pp. 1535-1539, 1968, USA.

U. Kaiser, N. Kaiser, P. Weilbrodt, U. Mademann, E. Hacker, and H. Muller, Structure of thin Fluoride films deposited on amorphous substrates, Thin Solid Films, vol. 217, Nos. 1-2, pp. 7-16, 1992, Switzerland.

J. L. Hollenbeck and R. C. Buchanan, Oxide thin films for nanometer electron beam lithography, J. Mater Res., vol. 5, No. 5, pp. 1058-1072, May 1990, USA.

K. W. Wong, Y. M. Wang, S. T. Lee, R. W. M. Kwok, Negative electron affinity on polycrystalline diamond surface induced by lithium fluoride deposition, Diamond and Related Materials, vol. 8, No. 10, pp. 1885-1890, 1999, Switzerland.

R. I. Hegde, Preparation, characterization, and activity of fluorinated aluminas for halogen exchange, Journal of Catalyst vol. 120, pp. 387-400, 1989.

* cited by examiner

METHOD OF FORMING A SEMICONDUCTOR DEVICE HAVING AN INTERLAYER AND STRUCTURE THEREFOR

FIELD OF THE INVENTION

This invention relates generally to semiconductor devices, and more specifically, to semiconductor devices having an interlayer between a conductive material and a dielectric material.

BACKGROUND

In the field of silicon CMOS (complementary metal-oxide semiconductor) fabrication, the use of metal gate is being considered. It is preferable that different metals are used for PMOS and NMOS devices so that the work functions can be optimized for each type of device. Changes in work function will affect the threshold voltage ($V_T$). For PMOS devices, it is desirable for the work function to be close to the silicon valence band edge of 5.2 eV, whereas for NMOS devices it is desirable for the work function to be close to the silicon conduction band edge of 4.1 eV. Furthermore, the materials should be thermally stable at the temperatures used to activate the subsequently formed source and drain regions.

If the materials chosen do not have the desired work function, short channel effects, including increased DIBL (drain induced barrier lowering) may undesirably occur. For example, there may be exacerbated $V_T$ roll-off and increased subthreshold swing.

However, current materials being considered for the gates for the PMOS devices and NMOS devices do not satisfy the above requirements. Therefore, a need exists for a structure that has the desired work functions for the PMOS or NMOS device and a process of forming such structure.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

An interlayer between a conductive material (e.g., an electrode) and a dielectric material is used, in one embodiment, to set the work function of NMOS and PMOS MOSFET (metal oxide semiconductor field effect transistor) devices. In one embodiment, a substrate is provided and a first stack is formed over the substrate, and forming the first stack includes forming a dielectric layer over the substrate, forming a first layer including a halogen and a metal over the dielectric layer, and forming a metal layer over the first layer. By placing an interlayer, such as $AlF_3$, between a dielectric (e.g., a high dielectric constant dielectric) and a conductive material (e.g., a metal gate electrode) the metal/dielectric interface dipole may be modulated to increase the effective metal work function. Hence, the interface may be used to modify the electrical properties of interfaces in MOSFETs. In addition, if the interlayer includes a halogen, such as fluorine, $V_T$ instability under electrical stress may be improved if the dielectric is doped with the fluorine as a result of forming the interlayer. Fluorine may be desirable because it can replace the undesirable chlorine (Cl) impurities that result when high dielectric constants dielectrics are formed. Furthermore, the interlayer can be used in other devices, such as DRAM (dynamic random access memory) capacitors and MIM (metal-insulator-metal) capacitors. In some embodiments, the interlayer (or more than one interlayer) is within a control electrode stack. The control electrode stack can be a gate stack (e.g., a gate stack for MOSFETs), a stack for a capacitor (e.g. it may include a metal, a dielectric, and interlayer(s)), a stack for a DRAM, a stack for a non-volatile memory device (NVM), or a stack for another similar device.

Figure 1:
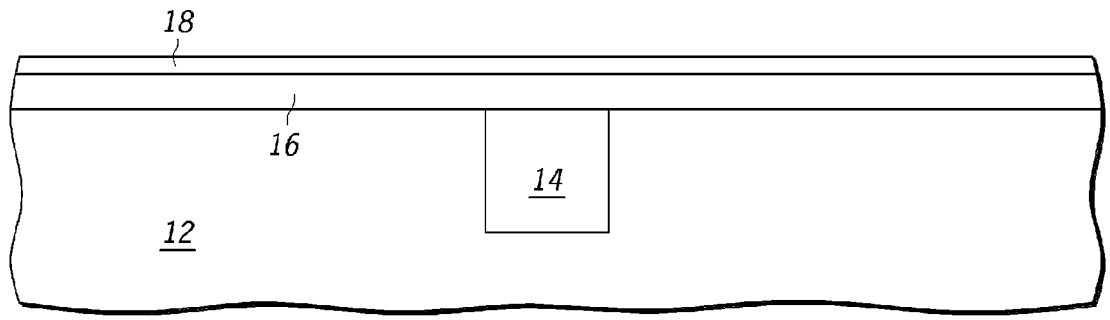
FIG. 1 illustrates a cross-sectional view of a portion of a semiconductor substrate after forming a dielectric layer and a first interlayer in accordance with an embodiment.

FIG. 1 illustrates a semiconductor device 10 including a substrate 12, a dielectric layer 16, and a first interlayer 18. The substrate 12 may be a metal, a semiconductor substrate, the like or combinations of the above. In a preferred embodiment, the substrate is a semiconductor substrate 12 and includes an isolation region 14, such as a shallow trench isolation (STI) region. The semiconductor substrate 12 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above.

The dielectric layer 16 in the embodiments illustrated in the figures is a first gate insulating layer 16, such as a high dielectric constant (high-k or hi-k) material (e.g., $HfO_2$, $Hf_xZr_{1-x}O_2$, or $Hf_xZr_yO_z$), silicon dioxide, or combinations of the above. A high-k material has a dielectric constant greater than that of silicon dioxide. The dielectric layer 16 can be formed by any suitable process such as thermal growth, chemical vapor deposition (CVD), atomic layer deposition (ALD), physical vapor deposition (PVD), the like, or combinations of the above.

The first interlayer 18, as will be understood after further discussion, is an interlayer between the dielectric layer 16 and a conductive layer, such as a metal gate electrode. In the embodiments illustrated in the figures, the first interlayer 18 is an interlayer for a PMOS transistor. In one embodiment, the first interlayer 18 is any metal halide, such as a metal fluoride, a metal chloride, a metal bromide, a metal iodide, or combinations of the above. A metal fluoride may be preferred because fluorine is more electronegative than other halides. If the first interlayer 18 is a metal fluoride, it may be rubidium fluoride (RbF), lithium fluoride (LiF), cesium fluoride (CsF), magnesium fluoride (MgF$_2$), strontium flrodie (SrF), and scandium fluoride (ScF), aluminum fluoride (AlF$_3$), any combination of a metal and a fluorine (e.g., a material including aluminum and fluorine, such as fluorinated aluminum oxide (Al$_2$O$_3$)), the like, or combinations of the above. As will be explained below some metal fluorides, such as rubidium fluoride (RbF), lithium fluoride (LiF), cesium fluoride (CsF), magnesium fluoride (MgF$_2$), strontium fluoride (SrF), and scandium fluoride (ScF), may be more suitable for setting work functions for NMOS devices.

Since in the embodiment illustrated in the figures the first interlayer 18 is used in a PMOS semiconductor device, it is desirable that the material chosen for the first interlayer 18 includes a relatively electronegative metal combined with a halogen, such as fluorine. One suitable material is a material including aluminum and fluorine, such as AlF$_3$.

AlF$_3$ is a preferred interlayer for PMOS devices, especially, because it includes a high concentration of electronegative fluorine atoms and a metal cation (aluminum) that is relatively electronegative compared to other metals. The high electronegativity of the elements in AlF$_3$ is expected to increase the effective work function of the PMOS device to a desirable level. Metals with higher electronegativity have higher vacuum work functions. In addition, effective work functions (barrier heights), at metal-dielectric (metal-semiconductor) interfaces are also related to the relative electronegativites of the contacting metal and dielectric. This is because electronegativity, which is the ability of an atom to attracted shared electrons to itself, determines how much charge exchange occurs at the metal-dielectric interface. The charge exchange at this interface results in an interface electronic dipole that determines, in part, the effective work function (or barrier height). The magnitude and polarity of the interface electronic dipole therefore depends on the relative electronegativies of the contacting metals and dielectrics.

In addition, AlF$_3$ has a melting temperature of approximately 1260 degrees Celsius, which is greater than the temperature typically used to activate dopants in the source and drain regions. (The dopant activation usually occurs at approximately 1000 degrees Celsius). Furthermore, AlF$_3$ should work well with an underlying hafnium oxide (HfO$_2$) layer, which may be used as the gate oxide, since AlF$_3$ is reported to not absorb water (H$_2$O.) Furthermore, AlF$_3$ is reported to have good mechanical strength.

If the first interlayer 18 is AlF$_3$ it can be formed over the dielectric layer 16 by any suitable process such as PVD (e.g., sputtering from an AlF$_3$ target or reactive sputtering of Al in an Ar/F$_2$ environment), ALD, CVD, e-beam deposited, the like, or combinations of the above. In addition, the first layer 18 is AlF$_3$, it may be formed by fluorinating an aluminum layer that was previously formed (e.g., formed by CVD, ALD, or PVD).

If the first interlayer 18 is fluorinated Al$_2$O$_3$, it can be formed by forming the Al$_2$O$_3$ and then fluorinating it. Whether fluorinating Al or Al$_2$O$_3$ (e.g., by ALD, CVD, or PVD), the fluorination can occur by using a gas or plasma of F$_2$, CF$_4$, C$_x$H$_y$F$_z$, NF$_3$, the like, or a combination of the above.

The first interlayer 18 may be between approximately 1 to approximately 15 Angstroms thick. It is preferred to have the first interlayer 18 as thin as possible to achieve the desired work function but thin enough as to not degrade the capacitance of the semiconductor device. Capacitance (C) is defined as the dielectric constant (κ) times the permittivity of real space (ε$_0$) times the area of the capacitor (A) all divided by the thickness of the dielectric (t), as shown below:

$$C = \frac{(\kappa \varepsilon_0 A)}{t}$$

Since capacitance is inversely proportional to dielectric thickness, it is desirable to minimize the thickness of the metal halide layer. In addition, the metal halide may have a lower dielectric constant than the dielectric layer which can also degrade the capacitance value.

In one embodiment, the dielectric layer 16 is a high-k dielectric and the first interlayer 18 is AlF$_3$, which has a dielectric constant of approximately 4. In this embodiment, if the AlF$_3$ is too thick it will undesirably offset the high dielectric constant of the high-k dielectric so that in effect, the AlF$_3$, which is insulating, and the high-k dielectric will both serve as the gate oxide with a lower dielectric constant than just the high-k dielectric alone; this is undesirable. It is preferred that the first interlayer 18 does not negatively effect the gate oxide and instead serves as an work-function modulating interlayer between the metal gate and the gate oxide. However, part or all of the first layer 18 may serve as part of the gate oxide.

Figure 2:
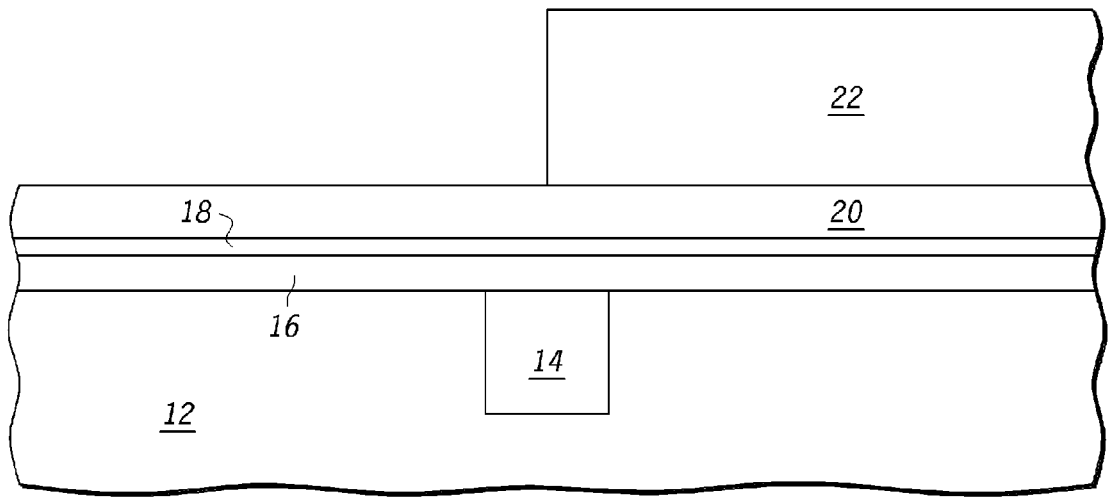
FIG. 2 illustrates the semiconductor substrate of FIG. 1 after forming a first metal electrode and a patterned mask in accordance with an embodiment.

As illustrated in FIG. 2 after forming the first interlayer 18, a first metal electrode 20 may be formed over the first interlayer 18. The first metal electrode 20 may be molybdenum nitride, molybdenum oxynitride, tungsten nitride, ruthenium oxide, ruthenium, titanium nitride, iridium oxide, the like or combinations of the above, which may be particularly suitable for a PMOS device, or tantalum carbide, tantalum silicon nitride, tantalum nitride, titanium nitride, hafnium carbide, hafnium nitride, zirconium carbide, zirconium nitride, tantalum carbide alloyed with another metal, the like, or combinations of the above, which may be particularly suitable for an NMOS device. In the embodiments illustrated in the figures, the first metal electrode 20 is the gate electrode for a PMOS device. The first metal electrode 20 can be formed by any suitable process, such as CVD, ALD, PVD, sputtering, the like, or combinations of the above.

A first patterned mask 22 may be formed over the semiconductor device 10, as illustrated in FIG. 2. In the embodiment illustrated, the first patterned mask 22 is formed over the area of the semiconductor device where a PMOS device will be formed (PMOS area). Thus the first patterned mask 22 exposes areas of the semiconductor device 10 where NMOS devices will be formed (NMOS area). (Although not illustrated a skilled artisan recognizes that the semiconductor substrate 12 may include wells that are doped either p-type or n-type depending on whether an NMOS or PMOS device is to be formed in that well.) The first patterned mask 22 can be any suitable mask, such as photoresist.

Figure 3:
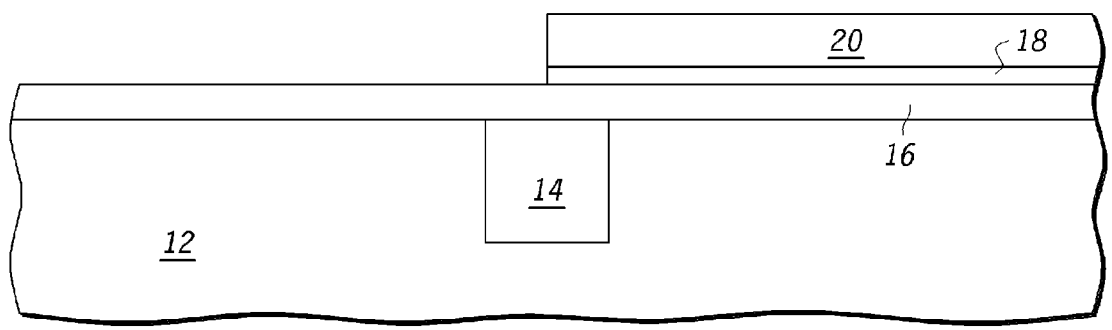
FIG. 3 illustrates the semiconductor substrate of FIG. 2 after removing portions of the first interlayer and the first metal electrode in an NMOS area in accordance with an embodiment.

As shown in FIG. 3 after exposing the area of the semiconductor device 10 in the NMOS area, the exposed portions of the first metal electrode 20 and the first interlayer 18 may be removed. In one embodiment, the first metal electrode 20 may be removed by wet etching in piranha or SC-1 (Standard Clean 1). A piranha clean consists of sulfuric acid, hydrogen peroxide, and water. An SC-1 clean consists of ammonium hydroxide, hydrogen peroxide, and water. The first interlayer 18, in one embodiment, may be removed in a wet etch by HPO$_4$, HNO$_3$, CH$_3$COOH, HCl, any other suitable chemistry, or combinations of the above. In one embodiment, the first interlayer 18 may be removed using a gas that includes HCl, Br$_2$, Cl$_2$, any other suitable chemistry, or combinations of the above. In one embodiment, tetra-methyl ammonium hydroxide (TMAH) may be used alone or in combination with any suitable chemistry, such as those described above. The first electrode 20 could be dry-etched using a chemical plasma selective to first interlayer 18 and then the interlayer 18 could be removed in a wet etch using chemistries described above.

Figure 4:
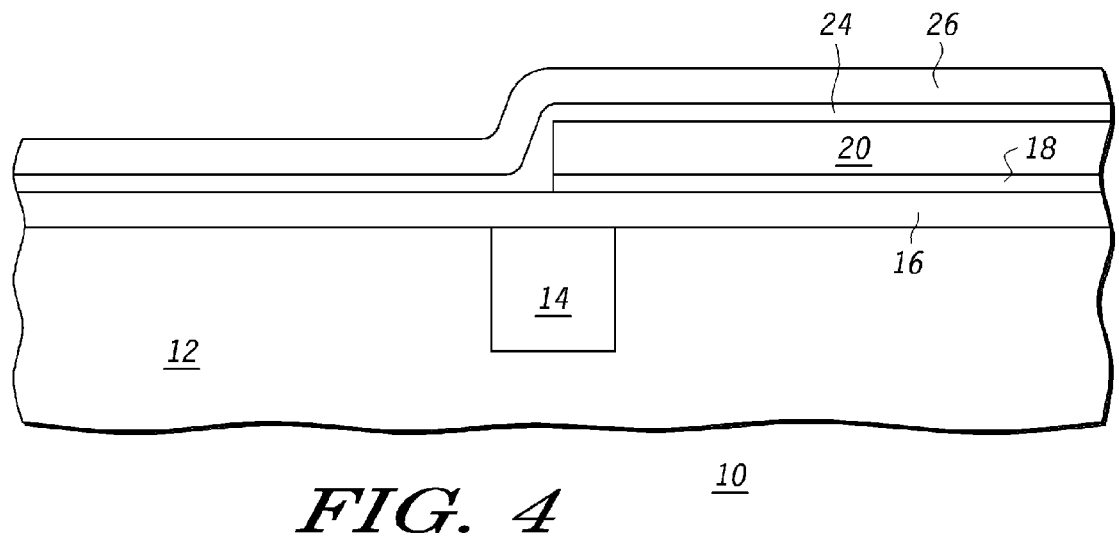
FIG. 4 illustrates the semiconductor substrate of FIG. 3 after forming the second interlayer and the second metal electrode in accordance with an embodiment.

After removing portions of the first metal electrode 20 and the first interlayer 18 in the NMOS area of the semiconductor device 10, a second interlayer 24 and a second metal electrode 26 may be formed over the semiconductor device, as illustrated in FIG. 4. In the embodiment illustrated, the second interlayer 24 and the second metal electrode 26 are formed over the dielectric layer 16 in the NMOS area and over the dielectric layer 16, the first interlayer 18, and the first metal electrode 20 in the PMOS area. The second interlayer 24 can be any material previously discussed for the first interlayer 18 and can be formed by any process previously discussed for the first interlayer 18. Since the second interlayer 24 is the interlayer for the NMOS area in the embodiments illustrated in the figures, the interlayer is preferably an interlayer material most suitable for NMOS devices, such as RbF, LiF, CsF, $MgF_2$, SrF, ScF, the like, or combinations of the above. For NMOS devices, it is preferred that the interlayer includes a metal that is relatively electropositive combined with a halogen, such as fluorine.

Figure 5:
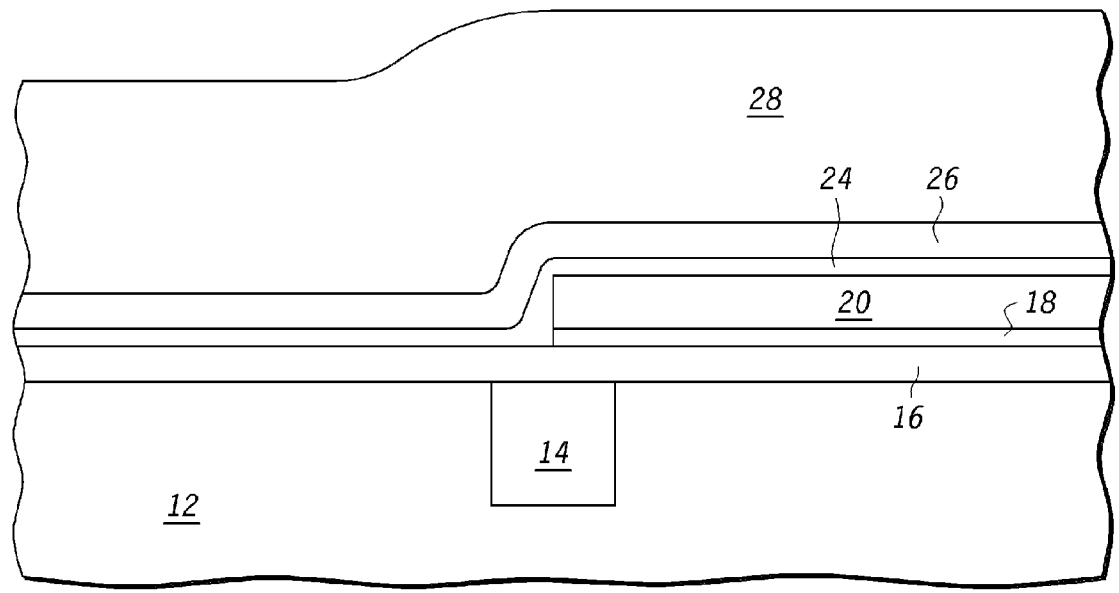
FIG. 5 illustrates the semiconductor substrate of FIG. 4 after forming a polysilicon gate electrode in accordance with an embodiment.
Figure 6:
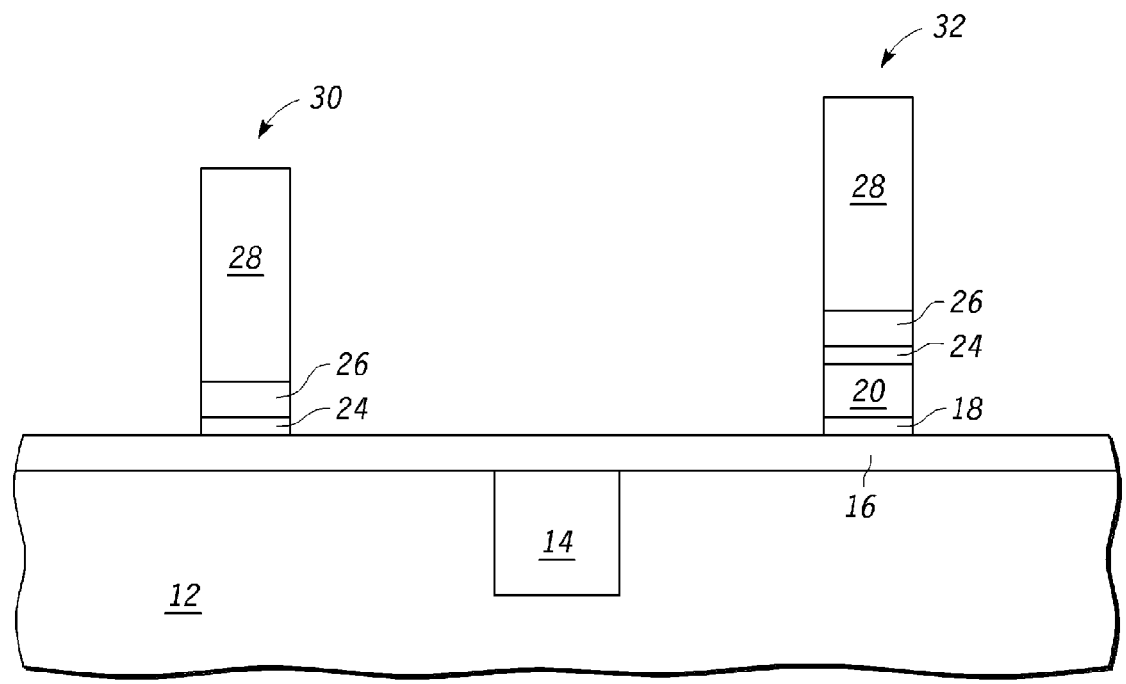
FIG. 6 illustrates the semiconductor substrate of FIG. 5 after patterning the semiconductor substrate of FIG. 5 in accordance with an embodiment.

After forming the second interlayer 24 and the second metal electrode 26, a polysilicon gate electrode 28 may be formed, as shown in FIG. 5. The polysilicon gate electrode 28 may be formed by any suitable process, such as CVD. The polysilicon gate electrode 28 is much thicker (even than that illustrated in the figures) than the underlying dielectric layer 16, first interlayer 18, first metal electrode 20, the second interlayer 24, and the second metal electrode 26. In one embodiment, the polysilicon gate electrode 28 is approximately 1,000 Angstroms thick.

Figure 7:
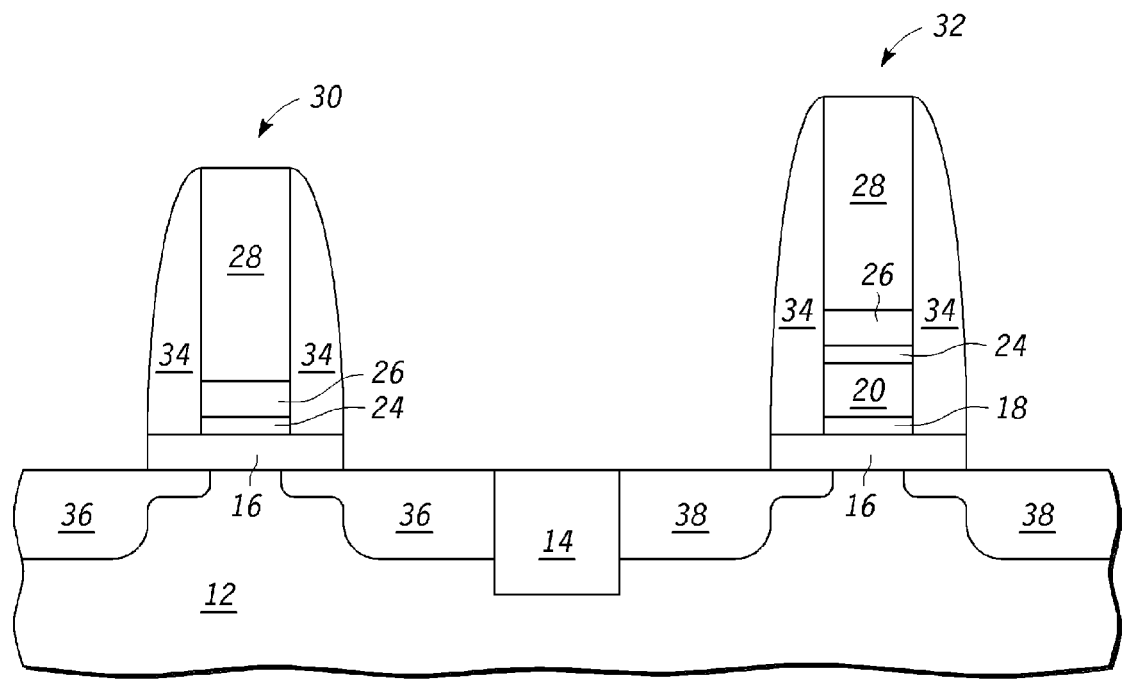
FIG. 7 illustrates the semiconductor substrate of FIG. 6 after further processing.

After forming the polysilicon gate electrode 28, if present, the gate stacks are patterned to form the NMOS gate stack 30 and the PMOS gate stack 32, as shown in FIG. 7. In the embodiment illustrated, the NMOS gate includes a portion of the dielectric layer 16, the second interlayer 24, the second metal electrode 26, and the polysilicon gate electrode 28. In the embodiment illustrated, the PMOS gate includes a portion of the dielectric layer 16, the first interlayer 18, the first metal electrode 20, the second interlayer 24, the second metal electrode 26, and the polysilicon gate electrode 28. It is desirable that the second interlayer 24 is thin enough to be discontinuous (e.g., approximately 1-approximately 15 Angstroms) so that the first metal electrode 20 and the second metal electrode 26 are electrically connected to each other. If the second interlayer 24 is not thin enough, it (and perhaps the second metal electrode 26) may be removed in the PMOS area. Thus, the PMOS gate stack may not include the second interlayer 24 or the second metal electrode 26.

In one embodiment, when forming the NMOS gate stack 30, the polysilicon gate electrode 28 can be patterned using (masks and) any suitable chemistry, such as $Cl_2$, HBr, $CF_4$, $CH_2F_2$ the like and combinations of the above. The second metal electrode 26 can be etched using any suitable process, such as a mask and the etching process previously discussed for removing the first metal electrode 20 from the NMOS area. The second interlayer 24 may be removed using any suitable process, such as a mask and the chemistries previously discussed for removing the first interlayer 18 from the NMOS area.

In one embodiment, when forming the PMOS gate stack 32, the polysilicon 28 can be patterned using (masks and) any suitable chemistry, as previously discussed for patterning the NMOS gate stack 30. The first interlayer 18, the first metal electrode 20, the second interlayer 24 (if present), and the second metal electrode 26 (if present) can be patterned using any suitable process previously discussed for patterning the second interlayer 24 and the second metal electrode 26.

After patterning the NMOS gate stack 30 and the PMOS gate stack 32, conventional processing is performed to form the NMOS source/drain regions 36, the PMOS source/drain region 38, and spacers 34. The NMOS source/drain regions 36 and the PMOS source/drain regions 38 may include extension regions and halo regions (not shown). The spacers 34 may be any suitable spacers, such as nitride spacers, L-shaped spacers, or spacers that include combinations of materials (e.g., nitrides and oxides). After forming the spacers 34, exposed portions of the dielectric layer 16 may be removed (i.e., the dielectric layer 16 may be patterned) using conventional processing. Subsequent conventional processing that is not illustrated may be performed to form features, such as interlevel dielectric layers and interconnect layers to connect various devices on the semiconductor substrates 12.

By now it should be appreciated that there has been provided a method for forming a semiconductor device with a gate electrode stack that includes a gate electrode and an interlayer so that the gate electrode stack has the desired work function for the device. The interlayer described also can be used in other devices, such as DRAM capacitors and MIM capacitor structures. For example, in DRAM and MIM capacitors it may be desirable to form an interlayer that has a metal and a halide (e.g., fluorine) between the top electrode and the dielectric, the bottom electrode and the dielectric, or both. Thus, in the embodiment where the structure is a MIM structure, the semiconductor substrate 12 may be a metal substrate.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method comprising:
   providing a substrate; and
   forming a first stack over the substrate, wherein the forming the first stack includes:
      forming a dielectric layer over the substrate;
      forming a first layer including a halogen and a metal over the dielectric layer; and
      forming a metal layer over the first layer;
   forming a second stack over the substrate, wherein the forming the second stack includes:
      forming a second layer including a halogen and a metal over the substrate and the first layer; and
      forming a second metal layer over the second layer; wherein the second layer is characterized as being of a different composition than the first layer.

2. The method of claim 1 wherein the forming the first stack further includes forming a polysilicon layer over the metal layer.

3. The method of claim 1 wherein the forming the first stack further includes patterning the metal layer and the first layer.

4. The method of claim 1 wherein the first layer includes aluminum fluoride.

5. The method of claim 1 wherein the first layer includes at least one material selected from the group consisting of rubidium fluoride, lithium fluoride, cesium fluoride, magnesium fluoride, strontium fluoride, calcium fluoride, and scandium fluoride.

6. The method of claim 1 wherein the halogen of the first layer is characterized as fluorine.

7. The method of claim 1 wherein the first stack is characterized as a control electrode stack and the substrate includes a semiconductor material.

8. The method of claim 7 wherein the MOSFET device is characterized as a P-channel transistor.

9. The method of claim 1 wherein the forming the dielectric layer includes forming a dielectric layer characterized as a high dielectric constant material.

10. The method of claim 1 wherein the forming the metal layer includes forming a metal layer that includes at least one material selected from the group consisting of molybdenum nitride, molybdenum oxynitride, tungsten nitride, ruthenium oxide, ruthenium, titanium nitride, and iridium oxide.

11. The method of claim 1 wherein the forming the metal layer includes forming a metal layer that includes at least one material selected from the group consisting tantalum carbide, tantalum nitride, tantalum silicon nitride, titanium nitride, hafnium carbide, hafnium nitride, zirconium carbide, zirconium nitride, and titanium carbide.

12. The method of claim 1 wherein the forming the second stack further includes:
   removing the metal layer over a first region of the substrate and removing the first layer over the first region prior to the forming the second layer, wherein the second stack is formed in the first region.

13. The method of claim 1 wherein the stack is characterized as a gate stack for a first MOSFET device and the second stack is characterized as a gate stack for a second MOSFET device, wherein the first MOSFET device is characterized as a P-channel transistor and the second MOSFET device is characterized as an N-channel transistor.

14. The method of claim 1 wherein:
   the forming the dielectric layer includes forming a layer including hafnium, zirconium and oxygen;
   the forming the first layer includes forming a layer including aluminum fluoride; and
   the forming the metal layer includes forming a layer including at least one material selected from the group consisting of molybdenum nitride and tungsten nitride.

15. A method comprising:
   providing a substrate; and
   forming a first stack over the substrate, wherein the forming the first stack includes:
      forming a dielectric layer including hafnium, zirconium, and oxygen over the substrate;
      forming a first layer including aluminum fluoride over the dielectric layer; and
      forming a metal layer over the first layer, wherein the metal layer includes at least one material selected from the group consisting of molybdenum nitride and tungsten nitride.

16. The method of claim 15 wherein the first stack is characterized as a control electrode stack and the substrate includes a semiconductor material.

17. The method of claim 16 wherein the MOSFET device is characterized as a P-channel transistor.

18. The method of claim 15 wherein the forming the dielectric layer includes forming a dielectric layer characterized as a high dielectric constant material.

19. The method of claim 15 further comprising:
   forming a second stack over the substrate, wherein the forming the second stack includes:
      forming a second layer including a halogen and a metal over the substrate; and
      forming a second metal layer over the second layer; wherein the second layer is characterized as being of a different composition than the first layer.

20. The method of claim 19 wherein the second layer is formed over the first layer.

21. The method of claim 19 wherein the forming the second stack further includes:
   removing the metal layer over a first region of the substrate and removing the first layer over the first region prior to the forming the second layer, wherein the second stack is formed in the first region.

22. The method of claim 19 wherein the stack is characterized as a gate stack for a first MOSFET device and the second stack is characterized as a gate stack for a second MOSFET device, wherein the first MOSFET device is characterized as a P-channel transistor and the second MOSFET device is characterized as an N-channel transistor.

* * * * *

UNITED STATES PATENT AND TRADEMARK OFFICE
CERTIFICATE OF CORRECTION

PATENT NO.         : 7,445,976 B2                                                   Page 1 of 1
APPLICATION NO.    : 11/420525
DATED              : November 4, 2008
INVENTOR(S)        : Schaeffer et al.

It is certified that error appears in the above-identified patent and that said Letters Patent is hereby corrected as shown below:

Title page, item (54), under "Title", in Column 1, Line 3, delete "THEREFOR" and insert -- THEREOF --.

Column 1, line 3, delete "THEREFOR" and insert -- THEREOF --.

Column 7, line 46, in Claim 11, delete "consisting" and insert -- consisting of --.

Signed and Sealed this
Sixteenth Day of August, 2011

David J. Kappos
*Director of the United States Patent and Trademark Office*